United States Patent
Spalding, Jr. et al.

(10) Patent No.: US 8,633,741 B2
(45) Date of Patent: Jan. 21, 2014

(54) RESET GENERATOR

(75) Inventors: George Redfield Spalding, Jr., Edinburgh (GB); Roger Peppiette, Edinburgh (GB); Finbarr Christopher O'Leary, Edinburgh (GB)

(73) Assignee: Analog Devices, Inc., Norwood, MA (US)

( * ) Notice: Subject to any disclaimer, the term of this patent is extended or adjusted under 35 U.S.C. 154(b) by 58 days.

(21) Appl. No.: 13/252,919

(22) Filed: Oct. 4, 2011

(65) Prior Publication Data

US 2013/0082749 A1  Apr. 4, 2013

(51) Int. Cl.
*H03L 7/00* (2006.01)

(52) U.S. Cl.
USPC ............................ 327/142; 327/143; 327/198

(58) Field of Classification Search
USPC .......................................... 327/142, 143, 198
See application file for complete search history.

(56) References Cited

U.S. PATENT DOCUMENTS

| | | | | |
|---|---|---|---|---|
| 4,208,594 A | | 6/1980 | Guicheteau | 307/200 |
| 4,788,462 A | * | 11/1988 | Vesce et al. | 327/546 |
| 5,469,099 A | * | 11/1995 | Konishi | 327/198 |
| 6,078,207 A | * | 6/2000 | Oguri | 327/321 |
| 6,631,505 B2 | * | 10/2003 | Arai | 716/106 |
| 6,949,965 B1 | * | 9/2005 | Jurgilewicz et al. | 327/143 |
| 2003/0122595 A1 | | 7/2003 | Hall et al. | 327/112 |
| 2006/0033539 A1 | * | 2/2006 | Jurgilewicz et al. | 327/143 |
| 2007/0085573 A1 | * | 4/2007 | Henzler et al. | 327/100 |
| 2009/0219066 A1 | * | 9/2009 | Shkidt | 327/143 |
| 2012/0019291 A1 | | 1/2012 | Hirai | 327/143 |

FOREIGN PATENT DOCUMENTS

| | | |
|---|---|---|
| DE | 19535541 A1 | 3/1997 |
| WO | WO-2013052203 | 4/2013 |

OTHER PUBLICATIONS

PCT Notification of the International Search Report and the Written Opinion of the International Searching Authority. Dated Nov. 7, 2012: for International Application No. PCT/US2012/050927.

* cited by examiner

*Primary Examiner* — Lincoln Donovan
*Assistant Examiner* — Brandon S Cole
(74) *Attorney, Agent, or Firm* — Schwegman Lundberg & Woessner, P.A.

(57) ABSTRACT

A reset circuit comprising: a first depletion mode device having a first terminal coupled to a node at a reset voltage and a second terminal for providing a reset signal to at least one device; and a control circuit arranged to switch the first depletion mode device into a high impedance state after a first predetermined period.

11 Claims, 5 Drawing Sheets

RESET GENERATOR

FIELD OF THE INVENTION

The present invention relates to a reset generator.

BACKGROUND OF THE INVENTION

Reset generators are used to apply a reset signal to processors and other circuits. Such a signal may be provided shortly after a circuit has powered up so as to ensure that it is in a known state. They may also be used to supply a reset signal in the event of power supply "brown out" or if a processor gets "hung" or otherwise stalled such that it is probable that its operation has become compromised.

It is well recognised that an important aspect of the "reset" function is to avoid giving false reset signals to the processor. As a result the reset generator is generally designed to be robust in the presence of noisy supplies.

A particularly difficult case is the state or evolution of the reset signal itself on initial power up of the reset circuit, especially when this coincides with device power up.

SUMMARY OF THE INVENTION

According to a first aspect of the present invention there is provided a reset circuit comprising:
 a depletion mode device having a first terminal coupled to a node at a reset voltage and a second terminal for providing a reset signal to at least one device; and
 a control circuit arranged to switch the depletion mode device into a high impedance state after a first predetermined period.

It is thus possible, by use of a depletion mode device, to provide a reset circuit in which a low impedance path is immediately established between a reset voltage source and a reset terminal even during power up of the reset generator itself.

In an exemplary embodiment of the invention the reset signal is an active low signal. Consequently the first terminal of the depletion mode device, which may be a transistor, is preferably coupled to a local ground. Advantageously the first terminal of the transistor is a source terminal and the second terminal of the transistor is a drain terminal.

Advantageously the control circuit includes a drive arrangement connected to a gate of the transistor such that a drive signal is applied to the transistor to force it into a more conducting state prior to the end of the first predetermined period, and then to switch the transistor into a non-conducting state after the end of the first predetermined period. Advantageously the duration of the first predetermined period may be set by a timer, such as a resistor-capacitor timer. Such a timer may be implemented as a mono-stable.

Advantageously a bias arrangement, such as a resistor connected to a supply rail, is provided to bias the reset signal to an inactive state when the transistor is not conducting.

According to a second aspect of the present invention there is provided an electrical device having a processor or other computing element in combination with a reset circuit constituting an embodiment of the first aspect of the present invention.

BRIEF DESCRIPTION OF THE DRAWINGS

The present invention will now be described by way of non-limiting example only with reference to the accompanying drawings, in which.

DESCRIPTION OF EXEMPLARY EMBODIMENTS

Figure 1:
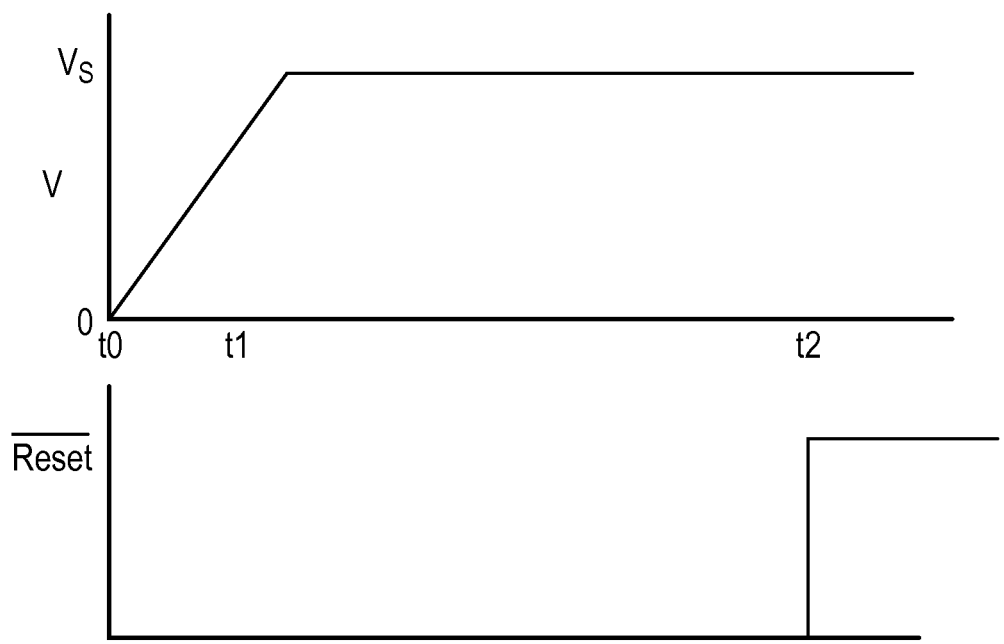
FIG. 1 schematically illustrates the idealised operation of a reset generator during application of a supply voltage to a circuit.

FIG. 1 shows the evolution with respect to time of the voltage supplied to a circuit at a switch on event, which will also be referred to as "power up". It has been assumed, for simplicity, that the supply is made via an electrically controllable switch such that undesirable features such as contact bounce have been eliminated. Connection to the supply is initiated at time T0. However due to the finite impedance of the voltage supply and the inclusion of capacitive components in the circuit, the supply does not rise instantaneously to its final voltage Vs but instead ramps up during a period spanning T0 to T1. The ramp has been drawn as linear although it may in practice have a non-linear component. After T1 the supply voltage can be assumed to be stabilised.

Electronic circuits including digital processors may power up in an undefined state. This may result in undesirable control signals being issued to components controlled by the processor. It is therefore known to provide a reset generator whose function is to hold a reset pin of a digital circuit in its reset state for a predetermined time period after initiation of the power up sequence, such that the supply to the processor or other digital components can be assumed to have become stable.

In the idealised arrangement shown in FIG. 1 the reset signal is active low, i.e. $\overline{reset}$, and the signal $\overline{reset}$ remains at zero volts until the time T2 where it gets released thereby allowing the processor to commence operation.

Figure 2:
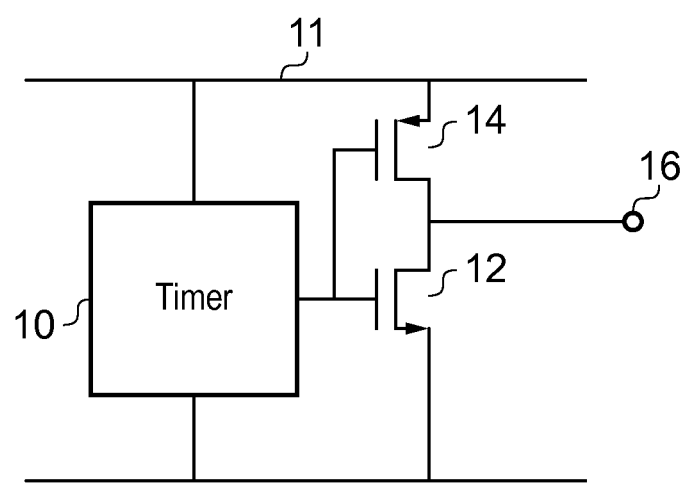
FIG. 2 schematically illustrates a prior art reset generator.

Such a power on reset has hitherto been provided by a circuit similar to that shown in FIG. 2. The circuit shown in FIG. 2 comprises a timer 10 connected to the power supply line 11. The timer typically comprises a resistor-capacitor circuit optionally in a mono-stable such that the output of the timer switches abruptly as the voltage across capacitor within the timer rises. Such a circuit is known to the person skilled in the art. The timer starts with its output "high" and at the end of the timer period the output of the timer goes "low". The timer 10 is connected to a series combination of a pull down transistor 12 and pull up transistor 14. The transistor technology may be field effect or bipolar. An output node 16 is connected to the interface between the transistor 12 and transistor 14. Consequently, when the pull down transistor is conducting, because the timer is still counting out its timer period, then the transistor 12 pulls node 16 down to the local ground. However, once the timer reaches the end of its timer period, the output of the timer goes low switching pull down transistor 12 into a non-conducting state, and the pull up transistor 14 on. Thus the pull up transistor 14 now pulls node 16 high, thereby releasing the reset signal.

Figure 3:
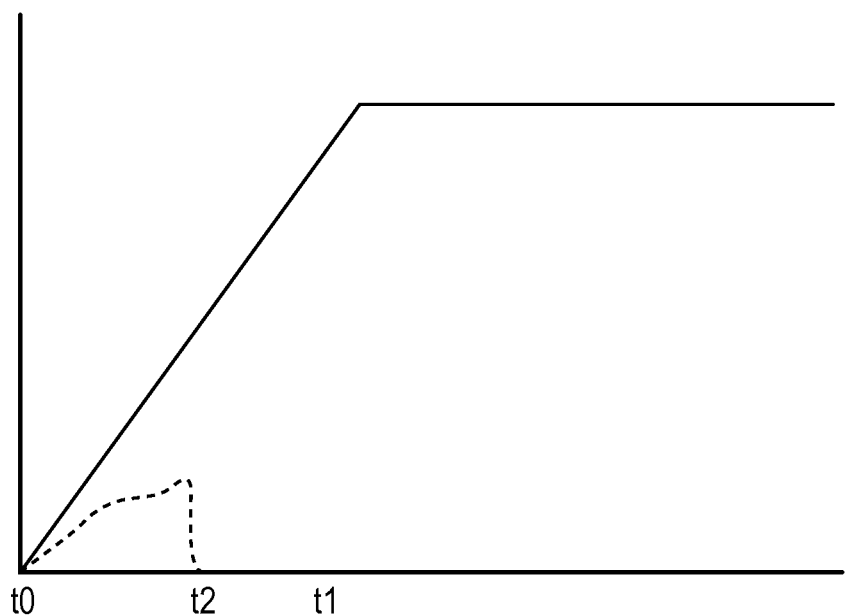
FIG. 3 schematically illustrates a potential evolution with respect to time of the reset voltage during power up.

A potential issue is that the timer may itself not come up cleanly upon restoration of power. During the period where the power supply is ramping up between zero and Vs, parasitic capacitances within the timer or other circuits connected to the reset node 16 may cause the voltage at the reset node 16 to fluctuate as schematically illustrated in FIG. 3. A microprocessor may have many gates, each exhibiting a capacitance, connected to its reset terminal. Consequently the capacitive load in the microprocessor may be quite large, and "plates" of these capacitors may drift upwardly in voltage as the supply becomes established. Furthermore, it will take a short time for the voltages within the reset circuit to establish such that the pull down transistor 12 is definitely on, and the pull up transistor is definitely off. Here the voltage at the reset node fluctuates between time periods T0 and T2.

Figure 4:
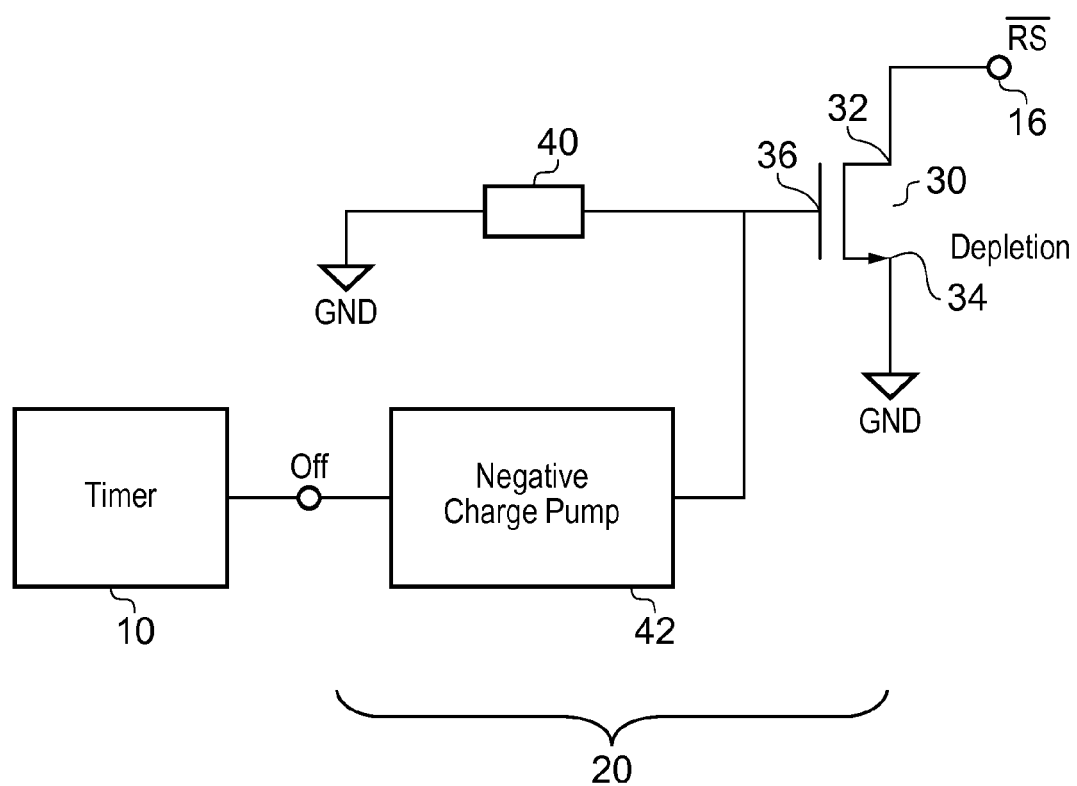
FIG. 4 schematically illustrates a reset generator constituting a first exemplary embodiment of the present invention.

FIG. 4 is a circuit diagram showing a first reset generator constituting an embodiment of the present invention. The reset generator which is generally designated 20, is responsive to a timer, for example of the type shown in FIG. 2 and designated 10.

The reset generator circuit comprises a depletion mode transistor 30 having its drain 32 connected to the reset output node 16. A source 34 of the transistor 30 is connected to the local ground which, in battery powered equipment, is typically connected to the negative terminal of the battery. A gate 36 of the transistor 30 is connected to ground via a resistor 40. The function of the resistor is to ensure that the gate voltage of the transistor 30 is well defined during the initial stage of application of the power supply to the circuit containing both the processor that needs to be reset and the reset generator 20.

Because the field effect transistor 30 is a depletion mode device, the transistor is conducting immediately, and the "pull down" strength of the reset node 16 to ground is determined by the size of the FET and its characteristics at $V_{GS}=0$.

The reset circuit also contains a charge pump 42 responsive to the timer 10 and connected to the gate 36 of the transistor 30. The resistor 40 holds the gate of the transistor at ground whilst the charge pump remains off. The construction and operation of charge pumps is well known to the person skilled in the art but by way of a reminder they operate by the selective connection and disconnection of capacitor terminals between supply voltages in response to a switching signal. This means that the charge pump will not become operative until the supply voltage to it and/or system clocks used by the charge pump to control the switching therein have become sufficiently established in order to cause the clocks to operate. Consequently there is no risk of the charge pump 42 becoming accidentally operative during the period T0 to T1 shown in FIG. 1 and then the charge pump remains disabled because of the operation of the timer 10 until such time as the timer 10 times out. Once the timer 10 expires, and asserts its signal (for example by transitioning from "low" to high), the charge pump 42 becomes enabled thereby generating a negative voltage which pulls the gate electrode of the transistor 36 below ground, creating a voltage that is less than the negative voltage threshold of the depletion mode field effect transistor. This shuts the field effect transistor 30 off such that it is no longer conducting and allows the reset node to be pulled up by other means (such as a PMOS transistor or resistor to the positive supply rail), without incurring any power penalty due to the size of the field effect transistor.

Because the resistor 40 is substantially only loaded by the gate capacitance of the transistor 30, it can be made large and hence even when the charge pump is operating the combined power required to operate the charge pump and the dissipation resulting from current flow through resistor 40 can be made very low.

In the arrangement shown in FIG. 4, the strength of the "pull down" is substantially invariant, and remains largely independent of the supply voltage. Put another way, the resistance presented between node 16 and ground 34 is solely that dictated by the transistor when $V_{GS}=0$ and does not become modified as the supply becomes established. However the transistor could be made more conducting (less resistive) if the gate voltage was made more positive as the power supply became established until such time as it is desired to release the reset by turning the charge pump 42 on.

Figure 5:
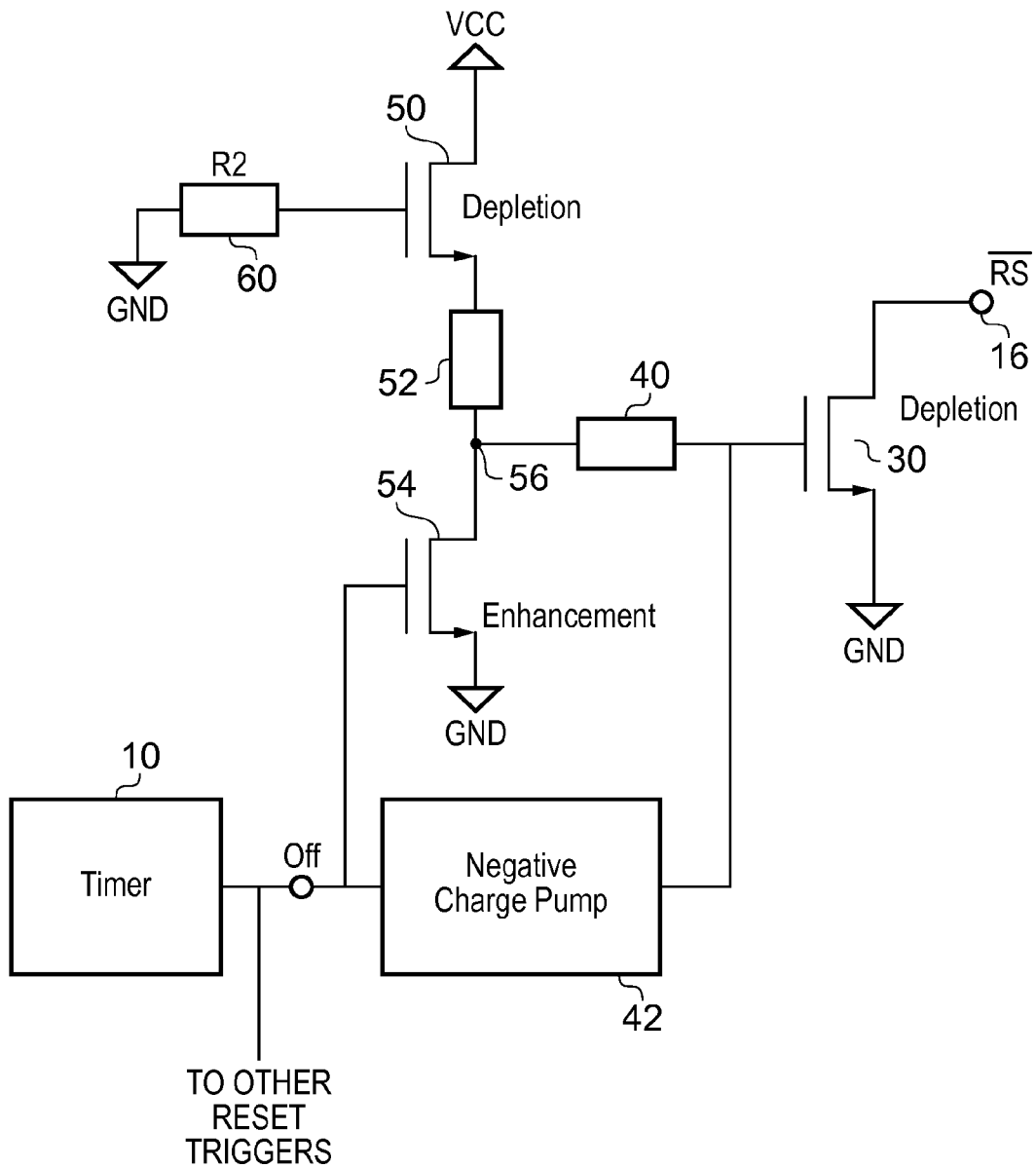
FIG. 5 is a circuit diagram of a reset generator constituting a second exemplary embodiment of the present invention.

FIG. 5 shows the circuit diagram for a second exemplary embodiment of the present invention. It represents a modification of the circuit shown in FIG. 4, and like parts are represented with like reference numerals. The field effect transistor 30 can now be regarded as being the first field effect transistor in the circuit, and it is joined by a second field effect transistor 50 in series combination with a resistor 52 and a third field effect transistor 54. The second field effect transistor 50 is a depletion mode device having its drain connected to the positive supply rail and its source connected to a first terminal of the resistor 52. The second terminal of the resistor 52 is connected to a first terminal of the resistor 40 and a drain of the third transistor 54. A source of the third transistor 54 is connected to ground. A gate of the second transistor 50 is connected to ground via a resistor 60. A gate of the third transistor 54, which is an enhancement mode device, is connected to receive the control signal generated by the timer 10.

Figure 6:
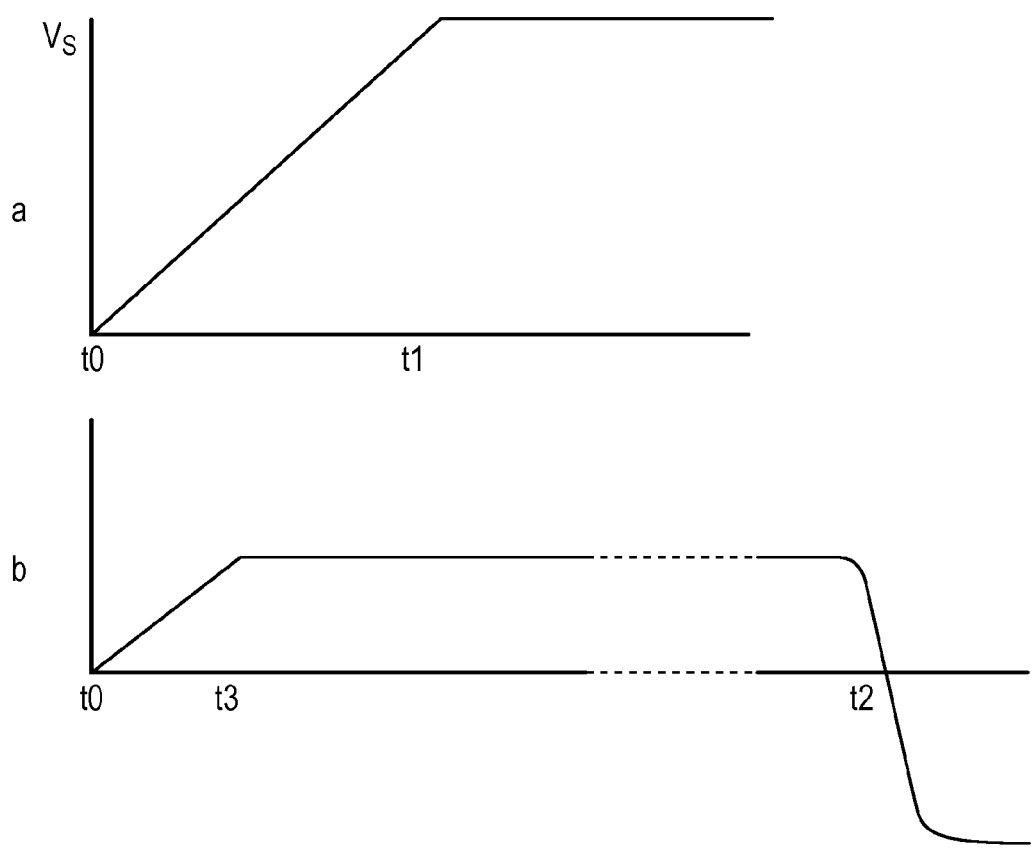
FIGS. 6a and 6b compare the evolution of the supply voltage with a control voltage at a gate of the output field effect transistor in the circuit shown in FIG. 5.

Whilst the timer is counting out its time period and its output (in this example) is low, the third transistor 54 is switched off. Starting from T0 when the supply is initiated, as shown in FIG. 6, the supply voltage ramps upwardly towards $V_S$ at time T1. This corresponds to the arrangement shown in FIG. 1. During this time, the voltage at the source of the second transistor 50 also ramps upwardly, effectively following the supply voltage, until such time as $V_{GS}$ for the second transistor 50 becomes sufficiently small to start to turn the transistor off. At this time the voltage at its source becomes effectively stable, as designated by time T3 in FIG. 6b. Thus the voltage supplied to the gate of the first field effect transistor 30 has now risen above zero volts and become clamped from T3 onward. The results in the first transistor 30 being driven further on, thereby having a lower on resistance between node 16 and ground. This enhanced conductivity continues until such time as the timer 10 times out and asserts its signal, its output going high, thereby switching the negative charge pump 42 on, and also switching the third field effect transistor 54 on. At this point the third field effect transistor 54 pulls the voltage at a node 56 between the first resistor 40 and the second resistor 52 down to ground, thereby causing the voltage applied to the gate of the transistor 30 to reduce. Near simultaneously, the charge pump 42 starts to become active supplying a negative voltage to the gate of the transistor 30 thereby dragging it below its voltage threshold and turning the transistor off.

It should be noted that until such time as the third transistor 54 is turned on there is no current in the resistor 52, and hence this is a very low power circuit. When transistor 54 is turned on, current passes through the resistor 52, thereby dissipating power equal to the voltage squared over the value of the resistor 52. This dissipated power can be kept low if resistor 52 is large. It will be observed that the third transistor 54 could be omitted and that the charge pump 42 could be used on its own to switch transistor 30 off. This would however increase the voltage difference across the resistor chain formed by resistors 40 and 52 potentially requiring use of a larger charge pump.

It should be noted that, if desired, a further stage comprising components arranged in a configuration similar to the second transistor 50, the resistor 52 and the third transistor 54 can be connected to the second resistor 60 in place of the ground terminal. Indeed, the input stages could be cascaded time and time again.

Turning to FIG. 6, it can be seen that once the timer expires the gate voltage at the gate of the first field effect transistor 30 goes negative at time T2 thereby causing the reset signal to be inhibited.

Although so far the timer has been shown as the only device capable of inhibiting or disabling the generation of the reset signal, other reset devices, such as watch dog timers, may be provided. As shown in FIG. 5, the control terminal to the charge pump 42 may also be connected to other reset triggers. This also applies to the arrangement shown in FIG. 4.

Although the embodiments have been described with the transistor 30 being a N type depletion mode device, it should be appreciated that P-type devices can also be used with a suitably modified drive circuit.

This application has been drafted for filing at the United States Patent and Trade Mark Office where single dependency claims are the norm. For other jurisdictions where multiple dependencies are allowed it is to be assumed that any dependent claim 1s dependent upon any preceding claim sharing the same independent claim, unless such a dependency is clearly technically not feasible.

The invention claimed is:

1. A reset circuit comprising:
   a first depletion mode field effect transistor (FET) having its gate connected to a local ground via a resistance, its source coupled to a node at a reset voltage and its drain providing a reset signal to at least one device; and
   a control circuit arranged to switch the first depletion mode FET into a high impedance state after a first predetermined period after initiation of a power up;
   wherein the control circuit includes,
      a charge pump coupled to generate a control signal to switch the first depletion mode FET into the high impedance state; and
      a timer circuit coupled to turn on the charge pump after the first predetermined time period.

2. A reset circuit as claimed in claim 1, in which the reset signal is an active low signal, and the source of said FET is connected to said local ground.

3. A reset circuit as claimed in claim 1, in which the control circuit is further arranged to provide a control signal prior to the end of the first predetermined period which enhances the conduction of the depletion mode FET.

4. A reset circuit as claimed in claim 1, in which the first predetermined period commences when power is supplied to the reset circuit.

5. A reset circuit as claimed in claim 1, in which a relatively low impedance path is maintained between the node and the at least one device up to the completion of the first predetermined period.

6. A reset circuit as claimed in claim 1, in which the control circuit further includes means for supplying a voltage to the first depletion mode FET to switch it off.

7. A reset circuit as claimed in claim 1, in which the control signal switches the first depletion mode FET off.

8. A reset circuit as claimed in claim 1, in which the control circuit includes a further arrangement for providing an enhanced control voltage to the first depletion mode FET to make the FET more conducting.

9. A reset circuit comprising:
   a first depletion mode device having a first terminal coupled to a node at a reset voltage and a second terminal for providing a reset signal to at least one device; and
   a control circuit arranged to switch the first depletion mode device into a high impedance state after a first predetermined period;
   said control circuit including a further arrangement for providing an enhanced control voltage to the first depletion mode device to make the device more conducting, said further arrangement comprising a second depletion mode device having a first terminal connected directly or indirectly to receive a supply voltage, and a second terminal arranged to supply a voltage to a gate terminal of the first depletion mode device.

10. A reset circuit as claimed in claim 9, in which the first and second depletion mode devices are transistors.

11. A reset circuit as claimed in claim 9, further comprising a third field effect transistor having one of its drain and source terminals connected to the second terminal of the second depletion mode device via a resistor and to a control terminal of the first depletion mode device via a resistance.

* * * * *